United States Patent [19]
Yokokawa

[11] Patent Number: 5,328,360
[45] Date of Patent: Jul. 12, 1994

[54] HEAT-TREATING APPARATUS

[75] Inventor: Osamu Yokokawa, Kanagawa, Japan

[73] Assignee: Tokyo Election Sagami Kabushiki Kaisha, Kanagawa, Japan

[21] Appl. No.: 124,547

[22] Filed: Sep. 22, 1993

Related U.S. Application Data

[62] Division of Ser. No. 858,002, Mar. 26, 1992, Pat. No. 5,271,732.

[30] Foreign Application Priority Data

Apr. 3, 1991 [JP] Japan ................................. 3-98132
Apr. 3, 1991 [JP] Japan ................................. 3-98133

[51] Int. Cl.5 ............................................. F27D 3/12
[52] U.S. Cl. .................................... 432/250; 432/241; 432/5; 432/6
[58] Field of Search ..................... 432/5, 6, 241, 153, 432/151, 250

[56] References Cited

U.S. PATENT DOCUMENTS

| | | | |
|---|---|---|---|
| 3,778,221 | 12/1973 | Bloom | 432/128 |
| 4,692,115 | 9/1987 | Aldridge et al. | 432/250 |
| 4,954,079 | 9/1990 | Yamaga et al. | 432/6 |
| 4,979,897 | 12/1990 | Yates | 432/250 |
| 5,055,036 | 10/1991 | Asano et al. | 432/5 |
| 5,221,201 | 6/1993 | Yamaga et al. | 432/241 |

Primary Examiner—Henry C. Yuen
Attorney, Agent, or Firm—Beveridge, DeGrandi, Weilacher & Young

[57] ABSTRACT

A heat-treating apparatus comprises a heat-treating portion which performs a required heat treating to a plural number of objects to be treated mounted on a heat-treating boat, a vacuum exhaust system which creates a vacuum inside the heat-treating portion, a load lock chamber which is connected so as to be freely openable and closable with respect to the heat-treating portion, which is filled therein with an inert gas and which is for transporting an object to be treated into and out of the heat-treating portion, and a residual treating gas exhaust system which is connected to the load lock chamber. Furthermore, in this heat-treating apparatus, there are also provided an oxygen concentration detector for detecting an oxygen concentration inside the load lock chamber, a door lock device provided in a vicinity of a maintenance door of the load lock chamber and which regulates opening and closing of the maintenance door, and a door lock control device which releases a lock of the door lock device when the oxygen concentration detector has detected a required oxygen concentration.

4 Claims, 6 Drawing Sheets

HEAT-TREATING APPARATUS

This application is a divisional of co-pending application Ser. No. 07/858,022 filed on Mar. 26, 1992, which is incorporated entirely herein by reference now U.S. Pat. No. 5,271,732.

BACKGROUND TO THE INVENTION

The present invention relates to a heat-treating apparatus provided with an interlock function for a maintenance door of a load lock chamber, and a treating gas exhaust duct.

In general, in apparatus such as oxidation dispersal apparatus and other apparatus for the heat-treating of semiconductor wafers, the oxidation dispersal reaction is performed in a high temperature status of 1200° C. for example, when compared to film growth processing by the CVD method. Because of this, when metal materials are used in the furnace portion of the heat treating furnace, metallic contamination of the semiconductor wafers may occur and when a corrosive gas is used as the treating gas, the metallic members that configure the interior of the furnace are corroded and the products formed are dispersed and attach to the surface of the semiconductor wafer, so that there is also the danger of their performance deteriorating. It is because of this that the treating vessel of a heat-treating furnace is configured of glass or some substance that has corrosion resistance and heat resistance. A tube for the introduction of the treating gas to the treating vessel of the heat-treating furnace and a tube for the exhaust of the gas after treatment are made of glass, and are mounted to form a unit with the heat-treating apparatus itself in a configuration where steam or the like is supplied to inside the treating vessel and oxidation dispersion treating for the semiconductor wafer is performed at normal pressure and in a high-temperature status of 200° C. for example.

Recent high integration of LSI such as the improved mounting density of MOSFET for example, has led to recent LSI such as 1.4 M DRAM for example, having a minimum design width of 1 μm or less, and for the film thickness of the gate oxide film being 200 Å or less. Also, the gate oxide films of 16 M DRAM are also tending to be thinner than 100-150 Å.

When the pre-processing prior to the film formation of the semiconductor wafer involves wetting and cleaning the silicon surface by HF (hydroflouric acid) and HCl (hydrochloric acid), there is a clean silicon surface on the semiconductor wafer after cleaning but the oxygen and water components in the atmosphere soon react with the silicon to form a natural oxidation film about 10 Å thick on the surface.

In addition, when there is a lateral type of heat-treating furnace, the boats mount the semiconductor wafers mounted to them are driven in the horizontal direction into a reaction vessel that has been heated to 1000° C. for example and are loaded, and there is the possibility that an opposing air flow caused by the temperature difference between the inside and the outside of the furnace may cause air to enter into the reaction vessel of the heat-treating apparatus. Because of this, when there is a lateral type of furnace, it is not possible to avoid the heated wafer reacting with the oxygen in the air when there is loading, and a natural oxidation film of 50-100 Å thick forming on the surface of the water. Also, since this natural oxidation film is porous and has a poor film quality, there is a limit to application to the high density elements for which control of the gate oxide film is necessary.

On the other hand, when a vertical type of heat-treating furnace is used, there is little intake of oxygen to inside the reaction vessel when compared to the case for the horizontal type of furnace and the thickness of the natural oxidation film formed is small at 30-50 Å. Because of this, vertical type heat-treating furnaces are mainly used for film growth in semiconductor wafers for 1 M DRAM.

However, with high densities of 4 M and 16 M for LSI, air is also taken in when there is loading and unloading to and from the furnaces used, and this, and the moisture component absorbed by the wafer cause the formation of a natural oxide film for which improved control is necessary. In particular, with increasingly high densities for semiconductor elements, control of the film thickness of the oxide film, control of the generation of the natural oxide film of around 10 Å and which is formed by the reaction between silicon and the water and oxygen in the atmosphere during the time after the wafer has been cleaned and when it is being transported to the heat-treating furnace, and the exclusion of oxygen and the residual water component inside the heat-treating furnace and that becomes the cause of the formation of the natural oxidation film are essential.

In addition, semiconductor wafer processing apparatus other than apparatus for the formation of oxide films also require control of the generation of excessive natural oxidation films when there is the formation of capacitance films and polysilicon films that require particularly small contact resistances.

The present invention has as an object the effective elimination of these problems and the provision of a heat-treating apparatus that can control the formation of natural oxidation films on semiconductor wafers when there is wafer loading to a heat-treating apparatus.

Also, in general, for vertical type heat-treating apparatus there has been proposed (such as in "Electronic Materials" (Denshi Zairyo) March, 1989; pages 38, 39) a load lock method that uses a configuration for the airtight control of the atmosphere when the semiconductor wafers are loaded to the furnace.

The conventional load lock method that is disclosed here has a boat raising and lowering mechanism and the like arranged at the bottom of a vertical type of heat-treating furnace, arranged inside a load lock chamber, and after the inside of the chamber has been made a vacuum, an inert gas such as nitrogen or the like is completely filled into the chamber. The loading of the boat to inside the furnace is performed after this. As a result, the natural oxidation of the surface of the wafer is prevented when there is loading, and the formation of natural oxidation films is strongly controlled.

In a load lock chamber of a vertical type of heat-treating furnace such as described above, it is necessary to perform maintenance of the boat raising and lowering mechanism that is housed inside it, or to clean the film that has adhered to the wafer boat for example, and so the maintenance door to the load lock chamber must be opened and closed comparatively frequently. In this case, the workers must enter the chamber in order to perform work to take the lowered wafer boat for example, to outside of the chamber. However, as has been described above, the inside of the chamber is filled to normal pressure with nitrogen or some inert gas, and in a worst case, entering the chamber could result in asphyxiation of the worker.

Not only this, even in cases where a worker stands near the door leading to the chamber but does not enter the chamber, the worker is nevertheless enveloped in a large amount of nitrogen gas when the maintenance door is opened. In addition, the capacity of the chamber is tending to become larger in order to house wafer boards for which the diameter is increasing to 8 inches or more, and for which the batch processing number per time is also increasing. This means that the problem described above must be solved all the more urgently.

In the light of the problem described above, the present invention is proposed for the effective elimination of the problem described above, and has as an object the provision of an interlock mechanism that releases the lock of the maintenance door of the chamber after the gas filled inside the load lock has been replaced by air and the oxygen concentration has attained a required value.

SUMMARY OF THE INVENTION

With the heat-treating apparatus of the present invention, there are provided a heat-treating portion that performs a required heat-treating to a plural number of semiconductor wafers or some other object for treating, a vacuum exhaust system for creating a vacuum inside said heat-treating portion, and a load lock chamber connected to the heat-treating portion so as to be freely openable and closable, for the carrying in and out of the object of treatment to and from a heat-treating portion and for filling an inert gas into the heat-treating portion.

Furthermore, there are also provided a heat-treating portion that performs a required heat-treating to a plural number of objects to be treated and which are housed in a treating boat, a manifold connected to an opening portion of the heat-treating portion, a vacuum exhaust system connected to the manifold and for creating a vacuum inside the treating portion, and a cooling means for cooling the entire manifold.

According to the present invention, the vacuum exhaust system is driven after the completion of oxidation treatment or some other heat treatment for the object of treatment inside the heat-treating portion, and the water vapor and oxygen components that cause the formation of the natural oxidation film by remaining inside the heat-treating portion are thereby exhausted. After this, the atmosphere inside is replaced with an inert gas such as nitrogen and made normal pressure. Then, the treated object of treatment is unloaded to the load lock chamber that is already held at normal pressure by the inert gas. When this is done, the heat-treating portion and the load lock chamber are connected but the steam and oxygen components inside the heat-treating portion have already been exhausted and so there is no flowing of these to inside the load lock chamber.

According to another invention of the present application, a vacuum is created in the status where the objects of treatment have been loaded to the heat-treating portion, and the steam and oxygen components inside are exhausted. When heat treating such as oxidation dispersal processing for example is performed to the object of treatment in the heat-treating portion, the entire manifold is cooled by a cooling means so that the surface of the metal manifold does not have its surface corroded by the metallic contamination of the semiconductor wafers and the gases when corrosive gases are used because of its high temperature. Then, after the completion of the heat-treating operation, the supply of treating gas to the heat-treating is stopped, the vacuum exhaust system connected to the manifold is driven and the steam, oxygen components and treating gas remaining inside the load lock chamber are exhausted. After this, the internal atmosphere is replaced by nitrogen and made normal pressure and the treated objects are unloaded.

Furthermore, according to still another invention of the present application, in an interlock apparatus that controls an opening and closing of a load lock chamber of a heat-treating apparatus that has been filled with an atmosphere such as nitrogen for example, is provided in the vicinity of a maintenance door inside the chamber, with an oxygen concentration detector that detects a concentration of oxygen inside the chamber, a door lock means that regulates the opening and closing of the maintenance door, and a door lock control means that releases the lock of the door lock means then the oxygen concentration detector detects a required concentration of oxygen.

According to the present invention, the load lock chamber that is filled with a gas other than oxygen, such as nitrogen for example, normally has the maintenance door locked by the door lock means to that it either does not open at all or opens only slightly. Then, when there is to be maintenance inside the chamber, the nitrogen gas inside the chamber is exhausted by the supply and exhaust system and is either forcedly replaced, or the maintenance door is opened slightly and the nitrogen gas is allowed to be naturally replaced by the outside air. Then, when the oxygen concentration detector detects a required oxygen concentration in the chamber, the door lock control means releases the door lock means and allows the maintenance door to be fully opened.

Other additional objects and features of the present invention will become clear from the following description, with reference to the appended drawings.

DETAILED DESCRIPTION OF THE PREFERRED EMBODIMENTS

The following is a detailed description of preferred embodiments of the present invention, with reference to the appended drawings.

Figure 1:
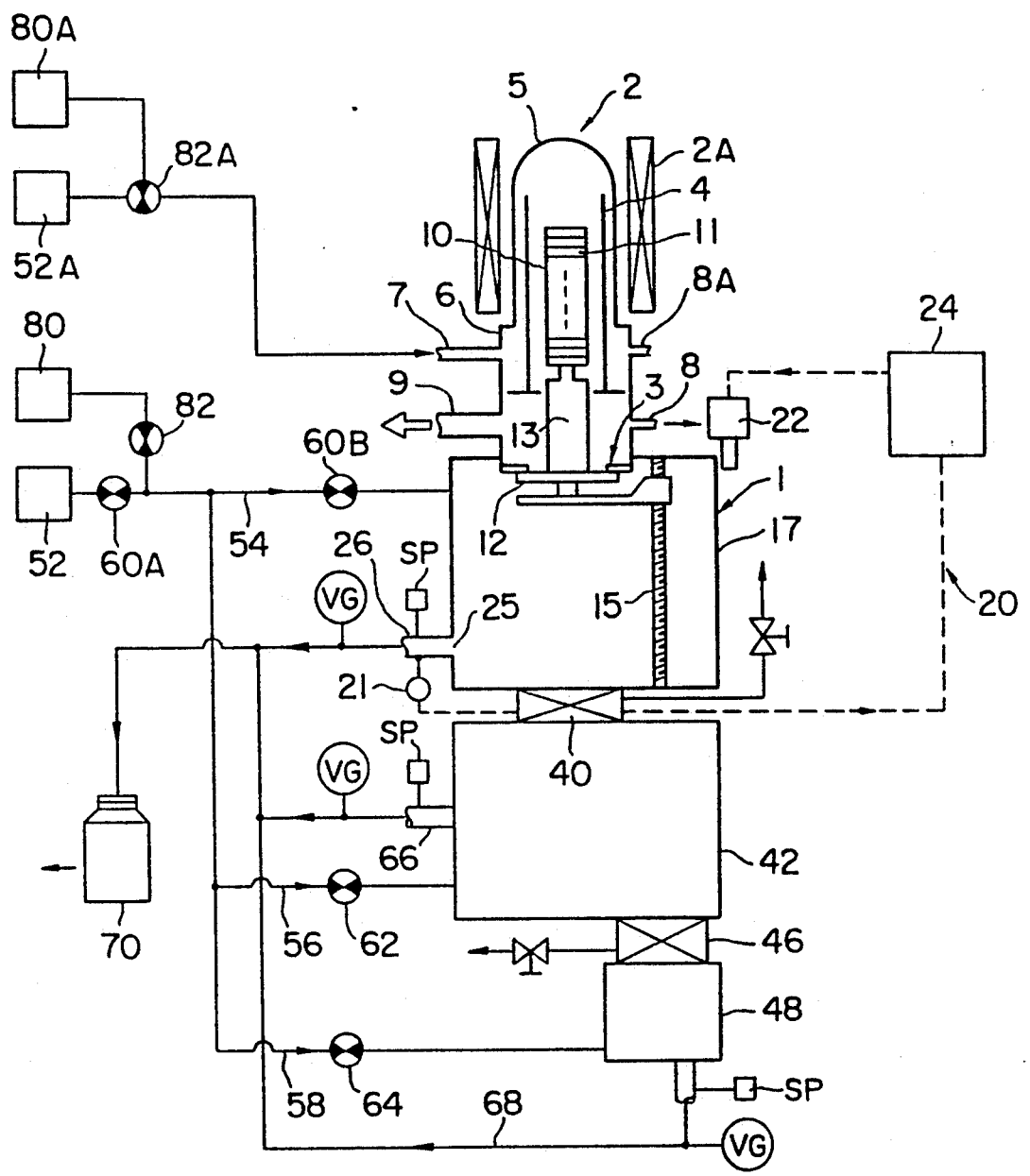
FIG. 1 is a view of an entire configuration of a heat-treating apparatus of the present invention.

In the present embodiment, the description will be given for the case when the present invention is applied to a horizontal type of heat-treating apparatus. As shown in FIG. 1, a load lock chamber 1 filled with a gas other than oxygen, such as nitrogen ($N_2$) or some other inert gas is formed from stainless steel for example, into a rectangular prism shape with length, width and height dimensions of 680 mm, 640 mm, 1520 mm respectively, for example, and positioned towards the top of this load lock chamber 1 is a horizontal type heat-treating apparatus 2. The inside of this heat-treating apparatus 2 and the inside of the load lock chamber 1 are configured so as to be communicable via an upper end opening portion of the load lock chamber 1.

The heat-treating apparatus 2 has an internal cylinder 4 that is formed into a cylindrical shape from glass for example, and an outer cylinder 5 that is also formed of glass and is concentric with the internal cylinder 4. To the outer periphery of the outer cylinder 5 is provided a heater 2A that heats the periphery of the, outer cylinder 5. A manifold 6 comprised of stainless steel for example, and which supports and fixes the internal cylinder 4 and outer cylinder 5 is provided with a treating gas inlet pipe 7 that lead the processing as in, a treating gas exhaust pipe 8 that exhausts the treating gas after treatment, and a vacuum exhaust system 9 that creates a vacuum inside the heat-treating apparatus 2. In addition, a nitrogen supply source 52A and a hydrogen source 80A connected in parallel to the treating gas inlet pipe 7 and via a switching valve 82A so as to be freely switchable. Then, inside the internal cylinder 4 is housed a plural number of semiconductor wafers 11 that are stacked and mounted at a required pitch up and down a glass wafer boat 10. This wafer boat 10 is provided via a temperature holding cylinder 13, to the cap portion 12 that opens and closes and seals the lower end opening portion of the manifold 6. Then, the cap portion 12, temperature holding cylinder 13 and the wafer boat 10 form one unit by the boat raising and lowering means 15 provided inside the load lock chamber 1, and are configured so that the inside of the load lock chamber 1 and the inside of the heat-treating apparatus 2 can be raised and lowered alternately.

On the other hand, to one of the side walls of the load lock chamber 1 is provided a maintenance door 17 that is freely openable and closable by workers performing periodic maintenance inside the load lock chamber 1. This maintenance door 17 is securely fixed to the load lock chamber 1 by a fixing means such as a bolt or the like when there is normal operation.

Figure 2:
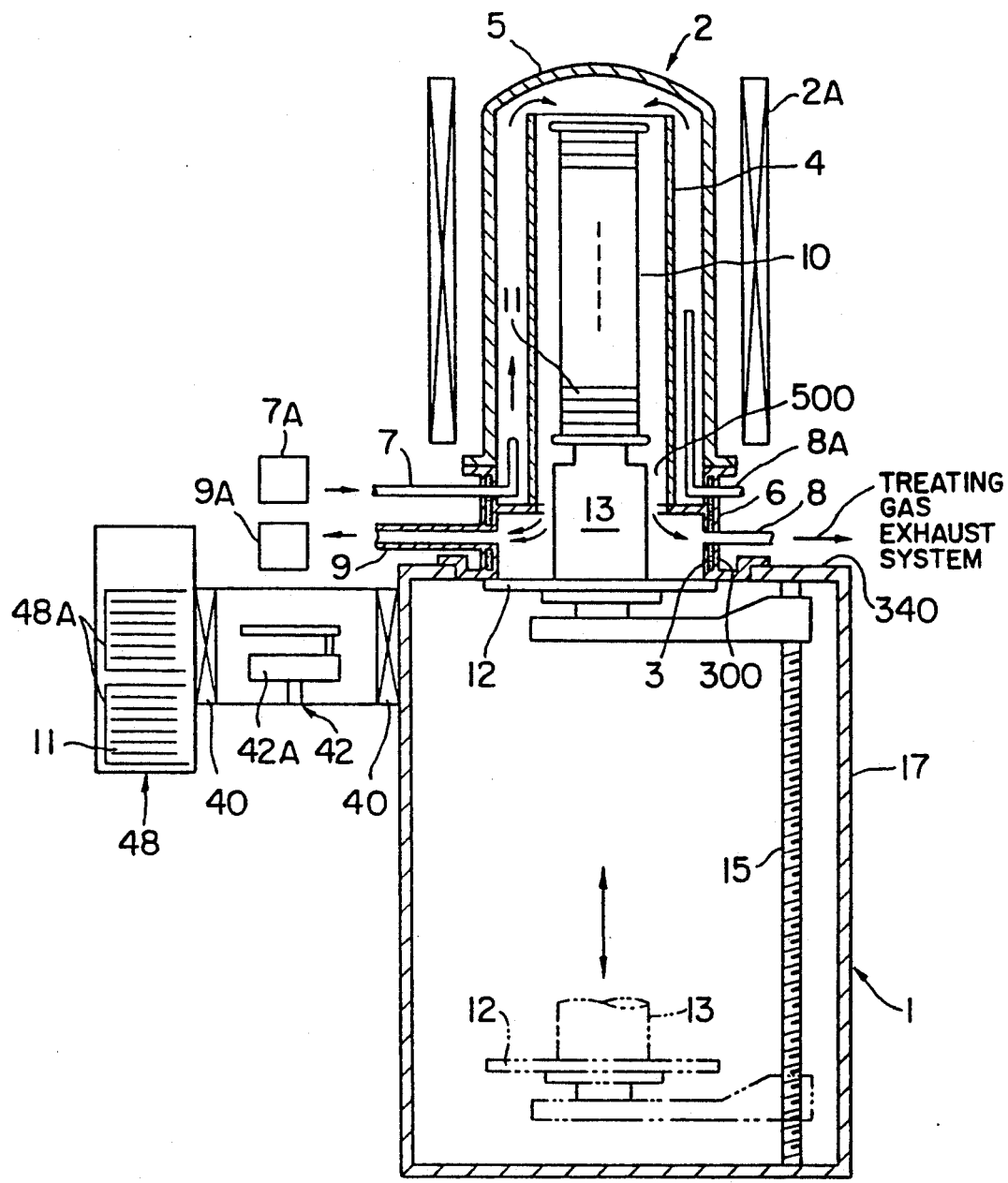
FIG. 2 is a longitudinal sectional view of a load lock chamber and a heat-treating portion of a heat-treating apparatus of the present invention.
Figure 4:
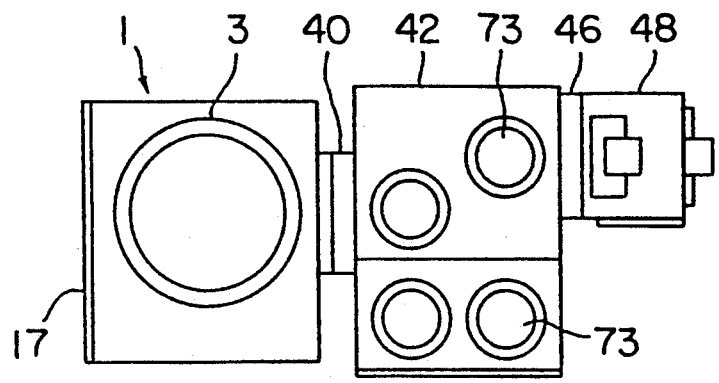
FIG. 4 is a plan view of a load lock chamber of a heat-treating apparatus of the present invention.
Figure 5:
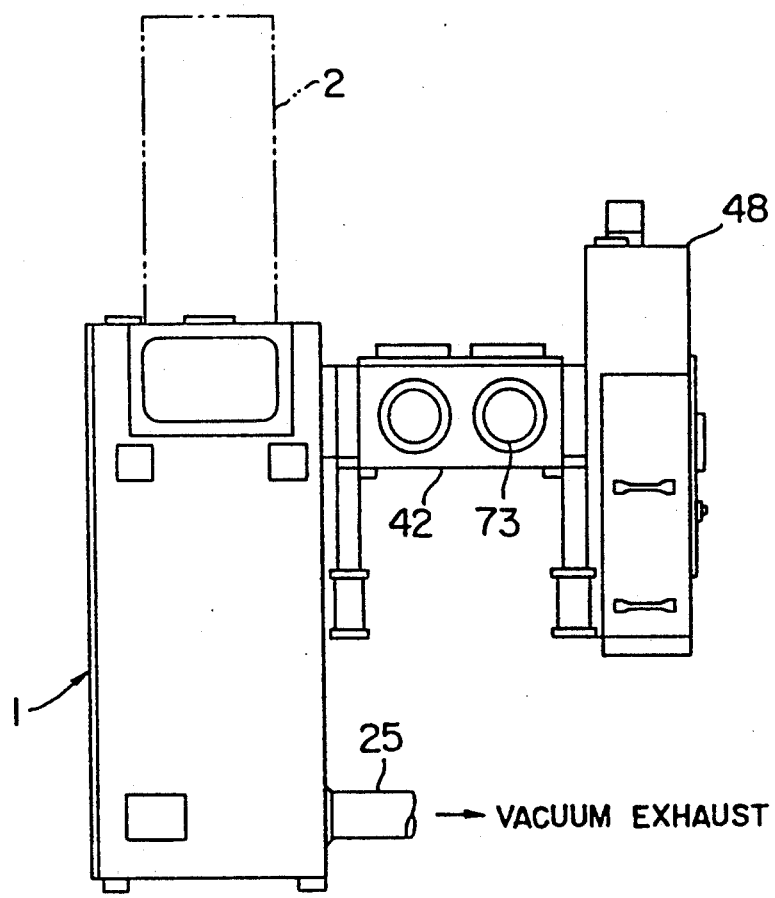
FIG. 5 is a frontal elevation view of a load lock chamber of a heat-treating apparatus of the present invention.

Then, the load lock chamber 1 is connected to a robot chamber 42 that is air sealed via a gate valve 40. As shown in FIG. 2, inside this robot chamber 42 is housed a cleaning apparatus (not shown) that removes a natural oxidation film that has formed on a surface of semiconductor wafers 11, and a moving apparatus 42A that moves semiconductor wafers 11 housed in a cassette 48A. As shown in FIG. 4 and FIG. 5, to the side wall of this robot chamber 42 is formed a plural number of monitoring windows 73 of glass or the like to permit observation of the status of internal operation.

Figure 6:
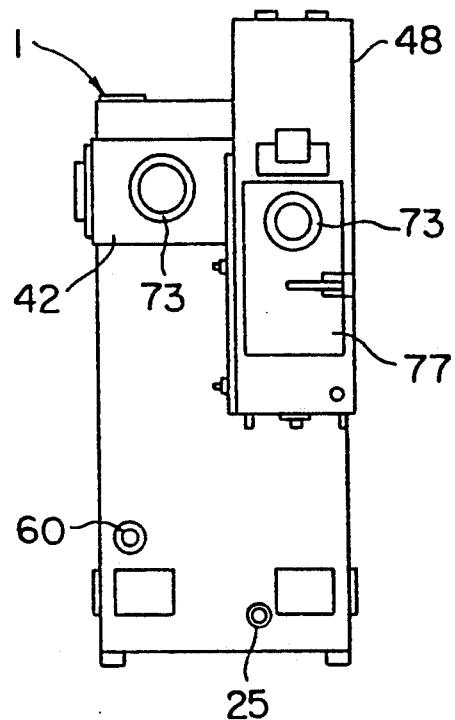
FIG. 6 is a side elevation view of a load lock chamber of a heat-treating apparatus of the present invention.

Then, a cassette chamber 48 is airtightly connected to the robot chamber 42 via a gate valve 46 and as shown in FIG. 6, the configuration is such that a cassette 48A that houses a plural number of semiconductor wafers can be carried into and out of the cassette chamber 48 via the opening and closing door 77.

Furthermore, as shown in FIG. 1, for example, nitrogen supply pipes 54, 56, 58 for the supply of nitrogen from a nitrogen supply source 52 are respectively connected to the load lock chamber 1, the robot chamber 42 and the cassette chamber 48 via switching valve 60A, and 60B, 62, and 64 respectively. Also, the cleaning air supply system 80 is connected in parallel with the nitrogen supply source via a switching valve 82, to allow the supply of cleaning air to the nitrogen supply pipes 54, 56, 58 in accordance with necessity. In the same manner, to each of the chambers 1, 42, 48 are connected exhaust pipes 26, 66, 68 for the respective vacuum exhausting of the chambers. Each of these exhaust pipes 26, 66, 68 are connected to a vacuum exhaust system 70 provided with a turbomolecular pump or the like, via an opening and closing valve (not shown) and a spare port SP for sampling and a vacuum gauges VG for observation of the pressure and the vacuum status.

Figure 3:
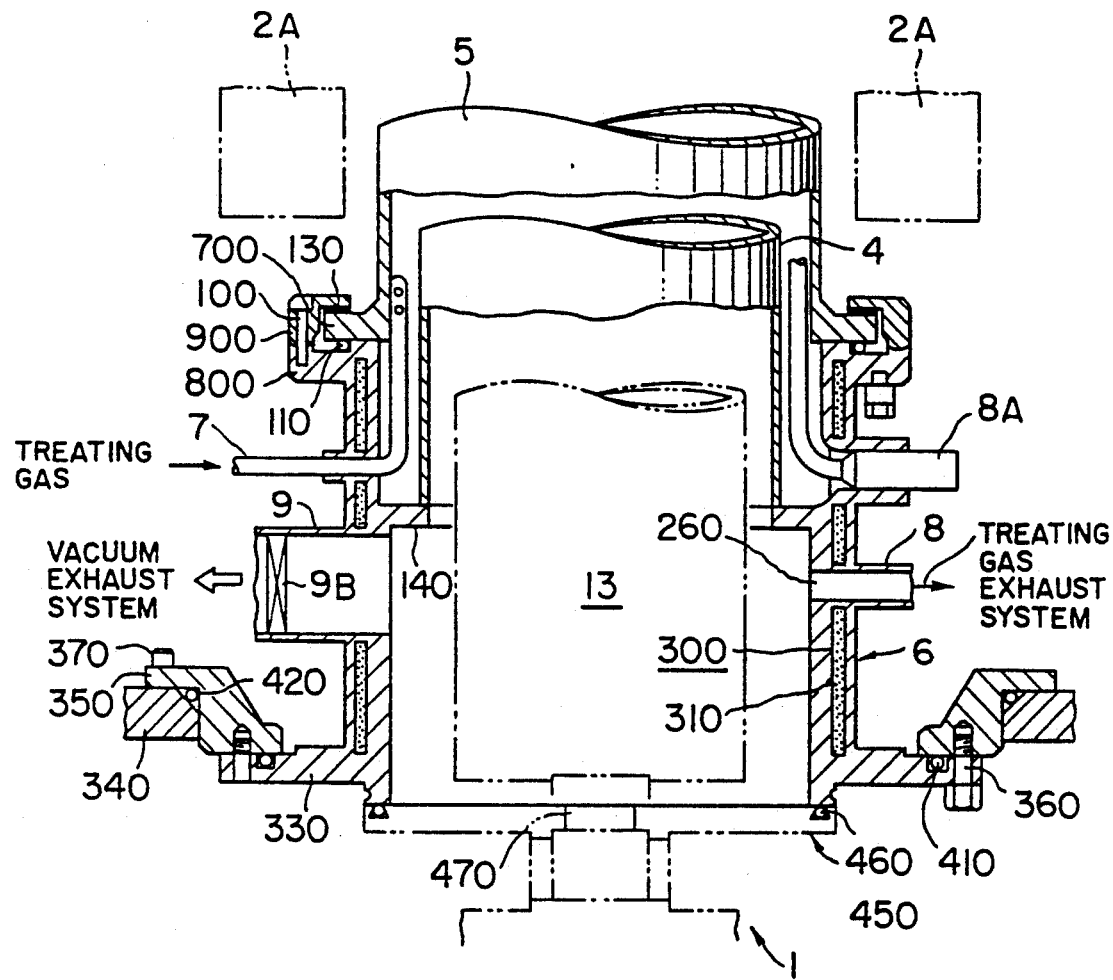
FIG. 3 is a partially enlarged sectional view showing major portions of a heat-treating portion of a heat-treating apparatus of the present invention.

In addition, as shown in FIG. 2 and FIG. 3, a ring-shaped flange portion 700 is formed at the lower distal end portion of the outer cylinder 5, and a similar ring-shaped flange portion 800 is also formed at the upper distal end portion of the manifold 6. Both of these ring-shaped flange portion 700 and ring-shaped flange portion 800 are fixed by bolts 100 via stopper members 900, and fix the outer cylinder 5 and the manifold 6.

In addition, to the contact surfaces of the ring-shaped flange portion 700 and ring-shaped flange portion 800 are provided O-rings 110 of flourine rubber or the like to maintain sealability. Also, between the upper surface of the ring-shaped flange portion 700 and the stopper portion 900 is provided a flexible packing member 130 of carbon fiber for example, which has good heat conductivity and promotes the discharge of heat from the ring-shaped flange portion 700.

Furthermore, a ring-shaped protruding portion 140 is fixed to the inner wall of the manifold 6 and this ring-shaped protruding portion 140 supports the lower distal end portion of the manifold 6. The upper portion side wall of the manifold 6 is pierced by a treating gas inlet pipe 7 of glass or the like, the distal end portion of which is upright and is arranged between the outer cylinder 5 and the internal cylinder 4, and is configured so that a spout portion 200 provided at the distal end portion discharges treating gas between the two cylinders. Also, as shown in FIG. 2, to the treating gas inlet pipe 7 is connected an inert gas supply source or a treating gas supply source such as a combustion apparatus 7A that burns oxygen and hydrogen for the generation of steam when oxidation treatment for example, is performed.

Furthermore, to the lower portion of the treating gas inlet pipe 7 is formed a vacuum opening 9 that has a relatively large diameter of 60 mm for example. Connected to this vacuum opening 9 via a vacuum exhaust pipe valve 9B, is connected a vacuum exhaust system 9A provided with a turbomolecular pump 9B for example, in a configuration where the interior of the vessel can be made a vacuum to a degree of $10^{-6}$ Torr for example. In addition, to the manifold 6 of a portion opposite the vacuum opening 9 is formed an exhaust opening 260 for the exhaust of the treating gas to outside the furnace. An exhaust pipe 8 is connected to this exhaust opening 260, in a configuration where treating gas that has been used is supplied to the treating gas exhaust system. Furthermore, to the tipper portion of the exhaust opening 260 is inserted a temperature measurement fitting 8A for the measurement of the temperature inside the treating chamber.

In addition, to the manifold 6 is provided a cooling means 300 for the cooling of the entire manifold 6 when there is oxidation dispersion treating. This cooling means 300 is configured to form a double pipe structure that forms a cooling water path 310 that passes cool water around the inside of the manifold 6.

Then, to the lower distal end portion of the manifold 6 is formed a ring-shape flange portion 330. This ring-shape flange portion 330 is configured by base bolts of stainless steel for example, and is supported and fixed to the upper wall side of the load lock chamber 1 by bolts 360 and 370 and via an auxiliary member 350. Towards the bottom of the manifold 6 is provided the load lock chamber 1 which requires airtightness and so O-rings 410, 420 are provided between the auxiliary member 350 and the upper surface of the ring-shaped flange portion 330, and to the contact surface portions of the auxiliary member 350 and the base plate 340.

On the other hand, the cap portion 450 of stainless steel for example, at the lower distal end opening portion of the manifold 6, is sealable via O-ring 460. To this cap portion 450 is inserted a rotating shaft 470 that can be freely rotated by a drive means (not shown). To the upper distal end of this rotating shaft 470 is mounted a temperature holding cylinder 13 of glass for example. Then, as has already been described, to the top of this temperature holding cylinder 13 is loaded the wafer boat 10 of glass for example, and which is the processing boat. Inside this wafer boat 10 are stacked for example, a plural number of semiconductor wafers 11 at a required pitch. Then, the cap portion 450 is configured so that the temperature holding cylinder 13 and the wafer boat 10 can be raised and lowered as a unit by the boat elevator 15.

Then, as shown in FIG. 1, the load lock chamber 1 is provided with an interlock mechanism 20 for the maintenance door 17. More specifically, this interlock mechanism 20 is configured by being provided with an oxygen concentration detector 21 that detects the concentration of the oxygen inside the load lock chamber 1, a door lock mechanism 22 provided in the vicinity of the maintenance door 17 and for regulating the opening and closing of the maintenance door 17, and a door lock control means 24 that releases the lock of the door lock mechanism 22 when the oxygen concentration detector 21 detects that the oxygen concentration is above a required value.

The oxygen concentration detector 21 is provided to the exhaust pipe connected to the exhaust opening at the lower portion side wall of the load lock chamber 1. In particular, this oxygen concentration detector 21 is provided as close to the exhaust opening 25 as possible, and is configured so that the oxygen concentration inside the load lock chamber 1 can be detected definitely. Moreover, the mounting position of the oxygen concentration detector 21 can be at the bottom portion or the top portion of the inside of the load lock chamber 1.

The output of this oxygen concentration detector 21 is connected to the door lock control means 24, and when the detected oxygen concentration has reached above of required value of 18% for example, the lock of the door lock mechanism 22 is released and the maintenance door 17 can be opened.

Figure 9:
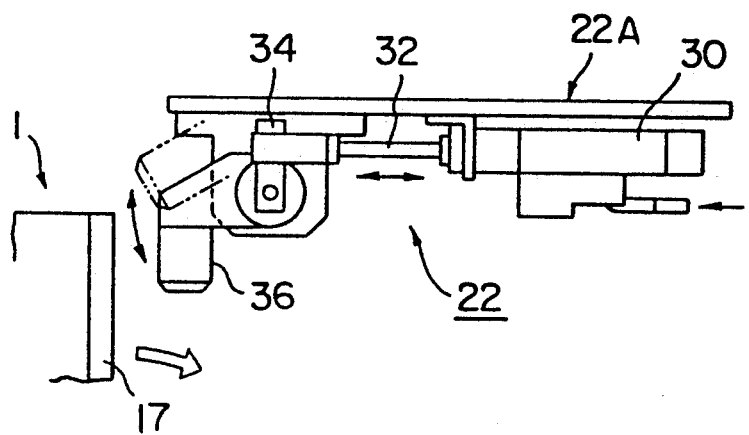
FIG. 9 is a plan view of a door lock means used in the interlock mechanism of the heat-treating apparatus of the present invention.

As shown in FIG. 9, the door lock mechanism 22 is configured from a cylinder 30 that is mounted to a required frame 22A, a piston 32 that is moved out by the action of the compressed air or the like from inside the cylinder 30, and a lock pin 36 at the distal end of the piston 32 and that via a crank, rotatably moves in and out immediately before the load lock chamber 1.

Figure 7:
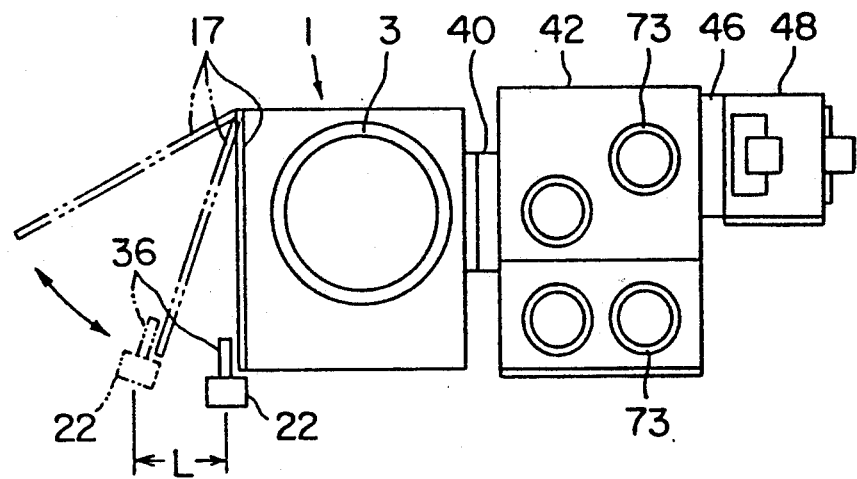
FIG. 7 is a plan view of a load lock chamber of a heat-treating apparatus of the present invention; and which is provided with an interlock mechanism for a maintenance door.
Figure 8:
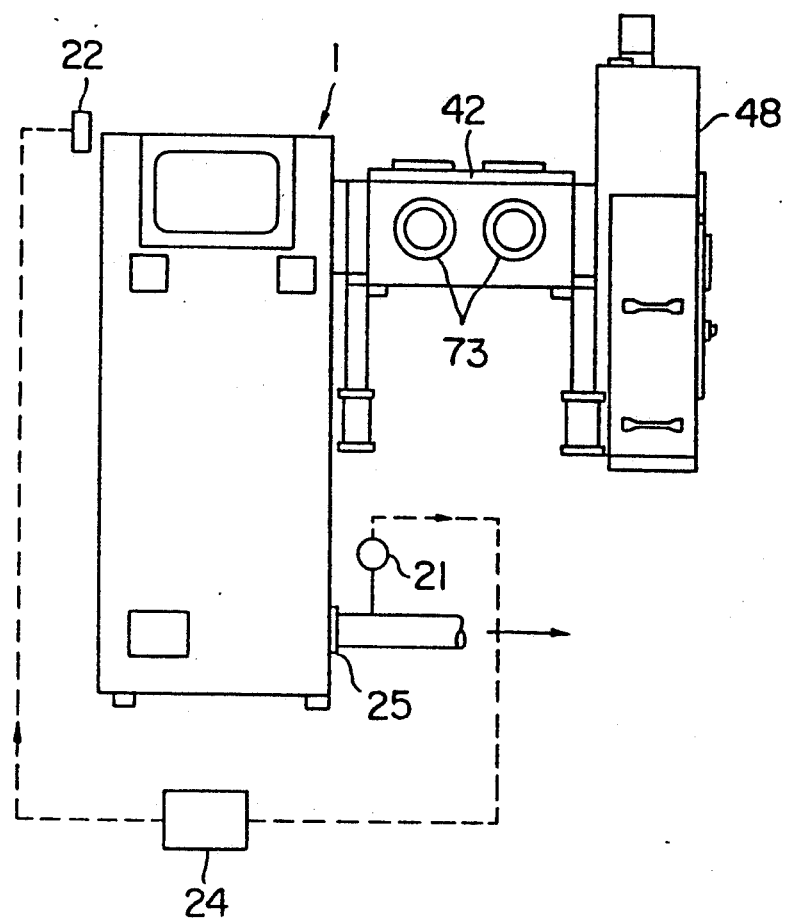
FIG. 8 is a frontal elevation view of a load lock chamber of a heat-treating apparatus of the present invention, and which is provided with an interlock mechanism for a maintenance door.

The mounting position of this door lock mechanism 22 is not limited to immediately before the maintenance door 17, and as shown in FIG. 7, for example, can be slightly separated from the maintenance door 17, at a position where the opening operation of the maintenance door 17 is locked at a degree of opening whereby a worker cannot place his head inside the load lock chamber 1.

The following is a description of the operation of an embodiment of the heat-treating apparatus of the present invention and having the configuration described above.

First, when oxidation dispersion treatment is performed, the treating gas exhaust pipe 8 connected to the manifold 6 of the heat-treating apparatus, and the vacuum exhaust systems 25, 66, 68 connected to the the robot chamber 42 and the cassette chamber 48, are driven for a long time and the entire heat-treating apparatus is made in a vacuum status of $10^{-5}$–$10^{-6}$ Torr for example. By this, the gases such as residual steam and oxygen components that remain inside each of the chambers, 1, 42, 48 and inside the treating vessel and which are the cause of the formation of a natural oxidation layer are definitely removed from inside the apparatus.

After the completion of this exhaust operation, nitrogen gas is supplied from the nitrogen supply source 52A and via tile treating gas inlet pipe 7 to inside the treating vessel so that the pressure inside the treating vessel becomes normal pressure. In addition, nitrogen gas is supplied from the inert gas (nitrogen) supply source 52 so that the pressure inside the load lock chamber 1, the robot chamber 42 and the cassette chamber 48 becomes normal pressure.

In this manner, once the internal pressure has become normal pressure, the opening and closing door 77 opens and the cassette transport means (not shown) transports the cassette 48A that houses a plural number (such as 25) of semiconductors, to inside the cassette chamber 48. The semiconductor wafers inside this cassette chamber 48 are held by sheet transfer means (not shown) and after tile natural oxide film on the surface of the wafers has been removed by cleaning, lowers inside the load lock chamber 1 and the semiconductor wafers are successively housed inside the wafer boat 10.

In this manner, once all of the semiconductor wafers 11 are housed inside the wafer boat 10, the boat elevator 15 raises the wafer boat 10 and houses it inside the heat-treating apparatus 2 as shown in FIG. 2. Then, the cap portion 12 airtightly seals the lower distal end opening portion 3 of the manifold 6. All of these processes up till now have been performed in an atmosphere of nitrogen at normal pressure and so there is no new formation of natural oxide film to the semiconductor wafers 11. Also, one each of these processes have finished, the each of the gate valves 40 and 46 are closed to stop movement of the gas in each of the chambers 1, 42, 48.

Then, when the semiconductor wafers 11 have been housed inside the heat-treating apparatus 2, the heater 2A heats the heat-treating apparatus 2 to a required temperature of approximately 1200° C. in the case when oxidation dispersion processing is to be performed.

After this, the switching valve 82A is switched and hydrogen is supplied from the hydrogen source 80A, and steam is generated by the combustion of hydrogen and oxygen inside the combustion apparatus 7A, and this is supplied from the discharge opening 200 via the treating gas inlet pipe 7, to between the internal cylinder 4 and the outer cylinder 5, and the pressure inside the treating vessel is maintained constant by exhausting from the exhaust pipe 8 and the oxidation treating performed. At this time, cooling water passes through the cooling water path 310 of the cooling means provided to the manifold 6 and this metal manifold 6 is cooled to a temperature of below 100° C. or preferably to below 70° C. thus metallic contamination of the semiconductor wafers and corrosion of the surface of the manifold 6 is prevented. In particular, in the case when the a corrosive gas such as $POCl_3$ is used for the oxidation dispersion processing, it is possible to control corrosion since the manifold 6 is cooled to beneath the temperature described above. Because of this, there is the prevention of the generation of particles that become the cause of a lowered yield of semiconductor wafers 11. In addition, at this time, if a cooling means comprising a water-cooled jacket is also provided to the cap portion 450, then it is possible for an enhanced corrosion suppression effect to be exhibited.

After oxidation dispersion processing has been performed for a required time as has been described above, the supply of steam from the treating gas inlet pipe 7 is stopped and then the vacuum exhaust system 9A is driven again and the inside of the treating vessel is again made a vacuum of $10^{-5}10^{-6}$ Torr in the same manner as described above, and after this, the gate valve 9B is closed and this status is held for a required time so that it is possible to completely remove any steam component and oxygen components that remain inside the treating vessel to become the cause of the formation of a natural oxidation film.

Once the exclusion of the steam component and oxygen component has been completed, an inert gas such as nitrogen is then supplied to inside the processing vessel, and the internal pressure is made normal pressure. Then, the boat elevator 15 lowers the wafer boat 10 and the semiconductor wafers 11 that have been treated are transported from the treating vessel. At this time, the load lock chamber 1 has a nitrogen atmosphere at normal pressure. In addition, the inside of the treating vessel of the heat-treating furnace and the load lock chamber 1 are communicated with each other via the lower distal end opening portion of the manifold 6 but as has been described, the residual steam component inside the treating vessel has already been completely removed and so there is no flow of steam components or the like to inside the load lock chamber 1.

After this, the reverse operation procedure is used to transport tile semiconductor wafers 11 that have been treated, to outside the apparatus and via the robot chamber 42 and the cassette chamber 48. On the other hand, untreated semiconductor wafers 11 are transported into the load lock chamber 1 and an operation procedure the same as that described is repeated.

In this manner, according to the present embodiment, there is a structure whereby the inside of the heat-treating portion 2 can be made substantially a complete vacuum, and whereby there is provided beneath it a load lock chamber 1 that is filled with an inert gas such as nitrogen or the like, and wherein before after the semiconductor wafers have been treated, the residual steam component and oxygen component inside the treating vessel are completely excluded to the exterior.

In addition, in tile embodiment described above, it is necessary to create a vacuum inside the heat-treating portion 2 and so it is necessary to provide a metallic manifold 6 but this portion can have a cooling means 300 provided to cool the entire manifold 6 and so it is possible to prevent the metallic contamination of the semiconductor wafers and the corrosion of the manifold 6 when corrosive gases are used in oxidation dispersion processing for example. Accordingly, it is possible to suppress the generation of particles that cause a lowering of the yield of semiconductor wafers 11 and to suppress the formation of natural oxidation films.

Furthermore, the sealability is raised using a manifold for the creation of a vacuum inside the treating vessel and so when compared to a conventional glass oxidation dispersion vessel, it is possible to improve the sealability with respect to toxic gases such as $POCl_3$, and for time safety of the workers to be enhanced.

In addition, in the embodiment described above, there is a double-walled structure wherein the outer cylinder 5 and the internal cylinder 4 are separated using the manifold and so when compared to a unitary double-walled structure in a conventional oxidation dispersion apparatus, it it possible to greatly reduce the manufacturing cost.

Moreover, in the embodiment described above, when the vacuum is created inside the treating vessel, flowing high-temperature water to tile cooling means 300 of the manifold 6 in a configuration where the entire manifold 6 is heated by a heating means provided to the outer periphery of the manifold 6 while the vacuum is being created enables the exclusion of residual steam and the like from the treating vessel to be further promoted and for there to be a reduction of the time required from exhaust operation, and for the completeness of the exhaust operation to be ensured.

In addition, the treating gas exhaust pipes for the vacuum exhaust pipes and the treating gas do not have to be separately provided, as they can be unified and the two functions switched by valve operation.

Furthermore, the embodiment described above can also be applied to normal oxidation dispersion apparatus that do not have vacuums created inside them, and can for example, be applied to CVD apparatus or other apparatus which is not for oxidation dispersion processing.

As has been described above, according to the present invention, it is possible to definitely exclude the residual steam component and the oxygen components from inside the heat-treating portion and for the flow of a steam component or the like to the inside to be prevented and so, it is possible to suppress the formation of a natural oxidation film to the surface of the semiconductor wafers.

Accordingly, it is possible to accurately form a uniform oxidation film of good quality on a semiconductor wafer surface to be treated, and for the demands for high integration of semiconductor products such as semiconductor wafers to be met.

The following is a description of operation for the case for periodic maintenance of the load lock chamber 1.

For example, it is necessary to open the maintenance door 17 of the load lock chamber 1 in order to clean and remove a film that has formed on a glass fitting such as a wafer board 10 when heat treating has been performed for the required number of times, or to allow maintenance and inspection of the boat raising and lowering means 15 inside or the load lock chamber 1. However, the load lock chamber 1 and the reaction vessel are in the status where they are filled with nitrogen at normal pressure. Moreover, at this time, the gate valve 40 is closed and partitions off the side of the robot chamber 42.

First, as shown in FIG. 7, the description will be for the case where is installed at the position indicated by the broken line, where it is slightly separated from the door lock mechanism 22.

When there is inspection and maintenance of the internal mechanisms inside the boat raising and lowering means 15 of the load lock chamber 1, the wafer boat 10 is housed inside the treating vessel and the opening portion 3 of the manifold 6 is sealed airtight by the cap portion 12. On the other hand, cleaning the wafer boat 10 involves lowering the wafer boat 10 to inside the load lock chamber 1 beforehand, and taking it from the load lock chamber 1 to outside.

When this is done, the oxygen concentration inside the load lock chamber 1 is detected by the oxygen concentration detector 21 and that detection value is transmitted to the door lock control means 24. Then, the door lock control means 24 controls the locking and unlocking of the door lock mechanism 22 in accordance with the value of the detected oxygen concentration.

Even if the worker who is performing maintenance removes the bolts and the like that fix the maintenance door 17 and attempts to completely open the maintenance door 17 when tile nitrogen concentration inside the load lock chamber 1 is still high and the value of the oxygen concentration is less than 18%, the maintenance door 17 will contact the lock pin 36 even if it is opened partially and will not open further. At this time, the opening distance of the maintenance door 17 is a set at a distance of 10–15 cm for example, which is such that the maintenance person cannot put his head inside. Because of this, if the oxygen concentration is still low, then it is not possible for a maintenance person enter beforehand to speed up the maintenance process, and therefore it is possible to prevent asphyxiation accidents.

In this manner, in the status where the maintenance door 17 is partially opened, the nitrogen inside the load lock chamber 1 is naturally replaced with the clean air inside the clean room outside, and the oxygen concentration inside rises gradually. Then, when replacement has proceeded and the oxygen concentration detector 21 detects that the oxygen concentration inside the load lock chamber 1 has reached 18%, the door lock control means 24 operates the cylinder 30 and the lock pin 36 of the door lock mechanism 22 is rotated to retreat and release the lock of the maintenance door 17. As a result, as shown in FIG. 7, it is possible for a maintenance person to fully open the maintenance door 17, and to perform maintenance work inside the load lock chamber 1 in a safe atmosphere.

In particular, when there is the natural replacement of the nitrogen inside the load lock chamber 1, there is always downflow of clean air inside the clean room wherein the heat-treating apparatus is installed and so the nitrogen inside the load lock chamber 1 is gradually replaced from the top.

The following is a description for the case where, as shown in FIG. 7, the door lock mechanism 22 is provided at a position indicated by the solid line, and is substantially in contact with the maintenance door 17.

In this case, it is not possible to have the natural replacement of the nitrogen inside the load lock chamber 1 as described above, since the maintenance door 17 can only open slightly, and so forced air replacement is performed for the load lock chamber 1.

In this case, as described with reference to FIG. 1, the vacuum exhaust system 70 connected to the load lock chamber 1 first exhausts the nitrogen inside the load lock chamber 1 to outside via the exhaust opening 25 and creates a vacuum inside the load lock chamber 1. Then, this vacuum exhaust system 70 either is stopped, or is driven to introduce clean air from the clean air supply source 80 to into the load lock chamber 1 via the supply pipe 54. In this process, if the oxygen concentration detector 21 detects that the oxygen concentration has reached 18% for example, then as described above, the lock pin 36 of the door lock mechanism 22 is rotated by the cylinder 30 and retreats from the front surface of the maintenance door 17 and unlocks the door. As a result, the worker can fully open the maintenance door 17 and perform maintenance work inside the load lock chamber 1 in a safe atmosphere.

Moreover, even if clean air is supplied and the pressure inside the load lock chamber 1 is normal pressure, but the oxygen concentration still has not reached a required value, there is insufficient vacuum exhaust operation to exclude the nitrogen and so further vacuum operation of the inside is performed. Here, when there is forced replacement, the reason for using clean air is that compressor oil and other contaminants are contained in the air that is used in factories and this oil would result in contamination of the inside of the apparatus. In addition, in the embodiment described above, the set oxygen concentration is not limited at 18%, but can be set around 10% for example, but in any case is made a concentration where a worker would not asphyxiate.

Moreover, in the embodiments described above, the description was given for the case where the present invention is applied to a heat-treating apparatus such as a CVD apparatus or an oxidation dispersal apparatus or the like, but the present invention is not limited to this, as it can of course be applied to load lock chambers that handled gases other than oxygen.

In the above, according to the present invention, air other than oxygen inside a load lock chamber is replaced, and until the oxygen concentration attains a required value, it is possible to lock a maintenance door so that it cannot open fully. Accordingly, the early entry of a maintenance person into the load lock chamber is strictly prevented while the oxygen concentration is low and so it is possible to enhance the safety of maintenance persons inside.

What is claimed is:

1. A heat-treating apparatus having a heat-treating portion performing a required heat treating to a plural number of objects to be treated mounted on a heat-treating boat, a vacuum exhaust system creating a vaccuum inside said heat-treating portion, and a load lock chamber filled with an inert gas and for transporting said object to be treated into and out of said heat-treating portion, comprising:

oxygen concentration detecting means for detecting an oxygen concentration inside said load lock chamber;

door lock means provided in a vicinity of a maintenance door of said load lock chamber and which regulates opening and closing of a maintenance; and door lock control means which releases a lock of said door lock means when said oxygen concentration detecting means has detected a required oxygen concentration.

2. The heat-treating apparatus according to claim 1, wherein said door lock means is provided immediately before said maintenance door.

3. The heat-treating apparatus according to claim 1, wherein said door lock means is provided at a slight distance from said maintenance door.

4. The heat-treating apparatus according to claim 1, wherein said door lock means comprises a cylinder, a piston which moves in and out of said cylinder, and a lock pin provided via a crank to a distal end of said piston and which rotates in and out immediately before said maintenance door.

* * * * *